United States Patent [19]
Razeghi

[11] Patent Number: 5,834,331
[45] Date of Patent: Nov. 10, 1998

[54] METHOD FOR MAKING III-NITRIDE LASER AND DETECTION DEVICE

[75] Inventor: Manijeh Razeghi, Wilmette, Ill.

[73] Assignee: Northwestern University, Evanston, Ill.

[21] Appl. No.: 733,271

[22] Filed: Oct. 17, 1996

[51] Int. Cl.⁶ .................................................. H01L 21/00
[52] U.S. Cl. ................... 438/40; 438/45; 438/46; 438/504; 438/506; 438/508; 438/509; 148/DIG. 3; 148/DIG. 55; 148/DIG. 66; 257/13; 372/45
[58] Field of Search .................................. 438/36, 39, 40, 438/45, 46, 504, 506, 507, 508, 509, 289, 334; 257/744, 745, 12, 13; 148/DIG. 3, DIG. 65, DIG. 66; 372/43, 45

[56] References Cited

U.S. PATENT DOCUMENTS

| | | | |
|---|---|---|---|
| 5,247,533 | 9/1993 | Okazaki et al. | 372/43 |
| 5,278,435 | 1/1994 | Van Hove et al. | 27/17 |
| 5,290,393 | 3/1994 | Nakamura | 25/22 |
| 5,306,662 | 4/1994 | Nakamura et al. | 21/203 |
| 5,334,277 | 8/1994 | Nakamura | 25/14 |
| 5,433,169 | 7/1995 | Nakamura | 25/14 |
| 5,468,678 | 11/1995 | Nakamura et al. | 21/203 |
| 5,583,879 | 12/1996 | Yamazaki et al. | 372/45 |
| 5,604,763 | 2/1997 | Kato et al. | 372/45 |
| 5,625,202 | 4/1997 | Chai | 257/94 |

OTHER PUBLICATIONS

Walker et al., "GaN based semiconductors for future optoelectronics", Inst. Phys. Conf. Ser. No. 145: Ch. 9, pp. 1133–1138 (1996 IOP Publishing Ltd.).

Kato, et al., "Defects of 6H–SiC substrates made by Acheson's method and by modified Lely's method", Inst. Phys. Conf. Ser. No. 142: Ch. 2, pp. 417–420 (1996 IOP Publishing Ltd.).

Nakamura et al., "Characteristics of InGaN multi–quantum–well–structure laser diodes", Appl. Phys. Lett., vol. 68:23, pp. 3269–3271 (Jun. 3, 1996).

Razeghi et al., "Semiconductor ultraviolet detectors", Appl. Phys. Rev., vol. 78:10, pp. 7433–7473 (May 15, 1996).

Walker, et al., "AlGaN ultraviolet photoconductors grown on sapphire", Appl. Phys. Lett., vol. 68:15, pp. 2100–2101 (Apr. 8, 1996).

Dovidenko et al., "Aluminum nitride films on different orientations of sapphire and silicon", J. Appl. Phys., vol. 79:5, pp. 2439–2445 (Mar. 1, 1996).

Kung, et al., "GaN, GaAlN, and AlN for use in UV detectors for astrophysics: and update", SPIE, vol. 2685, pp. 126–131 (Feb. 1–2, 1996).

Saxler, et al., "UV photodetectors based on $Al_xGa_{1-x}N$ grown by MOCVD", SPIE, vol. 2685, pp. 132–139 (Feb. 1–2, 1996).

Kung, et al., "Kinetics of photoconductivity in n–type GaN photodetector", Appl. Phys. Lett., vol. 67:25, pp. 3792–3794 (Dec. 1995).

Zhang et al., "Photovoltaic effects in GaN structures with p–n junctions", Appl. Phys. Lett., vol. 67:14, pp. 2028–2030 (Oct. 1995).

Zhang et al., "Growth of $Al_xGa_{1-x}N$:Ge on Sapphire and silicon substrates", Appl. Phys. Lett., vol. 67:12, pp. 1745–1747 (Sep. 1995).

(List continued on next page.)

*Primary Examiner*—John Niebling
*Assistant Examiner*—Long Pham
*Attorney, Agent, or Firm*—Welsh & Katz, Ltd.

[57] ABSTRACT

A p-i-n structure for use in photoconductors and diodes is disclosed, being formed of an $Al_xGa_{1-x}N$ alloy (X=0→1) with $In_yGa_{1-y}N$ (Y=0→1) which as grown by MOCVD procedure with the p-type layer adjacent the substrate. In the method of the subject invention, buffer layers of p-type material are grown on a substrate and then doped. The active, confinement and cap layers of n-type material are next grown and doped. The structure is masked and etched as required to expose a surface which is ion implanted and annealed. A p-type surface contact is formed on this ion-implanted surface which is of sufficiently low resistance as to provide good quality performance for use in a device.

16 Claims, 2 Drawing Sheets

OTHER PUBLICATIONS

Kung et al., "High quality AlN and GaN epilayers grown on (00.1) sapphire, (100), and (111) silicon substrates", Appl. Phys. Lett., vol. 66:22, pp. 2958–2960 (May 1995).

Kung et al., "Low pressure metalorganic chemical vapor deposition of high quality AlN and GaN thin films on sapphire and silicon substrates", SPIE, vol. 2397, pp. 311–320, (Feb. 1995).

Razeghi et al., "Ultra–Violet Detectors for Astrophysics, Present and Future", SPIE, vol. 2397, pp. 210–217 (Feb. 1995).

Zhang et al., "Photoluminescence Study of GaN", Acta Physica Polonica A, vol. 88:4, pp. 601–606 (1995).

Kung et al., "Crystallography of epitaxial growth of wurtzite–type thin films on sapphire substrates", J. Appl. Phys., vol. 75:9, pp. 4515–4519 (May 1994).

Sun et al., "A crystallographic model of (00.1) aluminum nitride epitaxial thin film growth on (00.1) sapphire substrate", J. Appl. Phys., vol. 75:8, pp. 3964–3967 (Apr. 1994).

Saxler et al., "High quality aluminum nitride epitaxial layers grown on sapphire substrates", Appl. Phys. Lett., vol. 64:3, pp. 339–341 (Jan. 1994).

Sun et al., "$Al_xGa_{1-x}N$ grown on (00.1) and (01.2) sapphire", Inst. Phys. Conf., Ser. No. 137, Ch. 4 pp. 425–428 (1994 IOP Publishing Ltd.).

Sun et al., "Comparison of the physical properties of GaN thin films deposited on (0001) and (0112) sapphire substrates", Appl. Phys. Lett., vol. 63:7, pp. 973–975 (Aug. 1993).

Sun et al., "Improvements on the structural and electrical properties of GaN thin films grown by Metalorganic Chemical Vapor Deposition using different substrate orientations".

Hoff et al., "Aluminum Free Normal Incidence GaAs/$Ga_{0.51}In_{0.49}P$ Quantum WII Intersubband Photodectors".

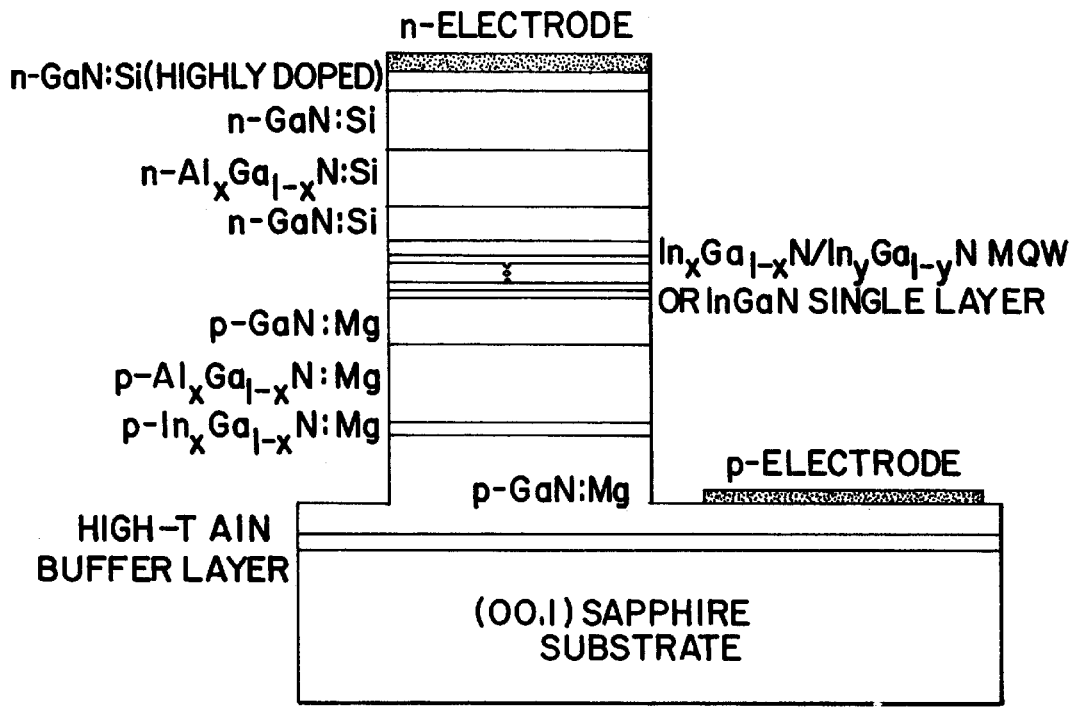
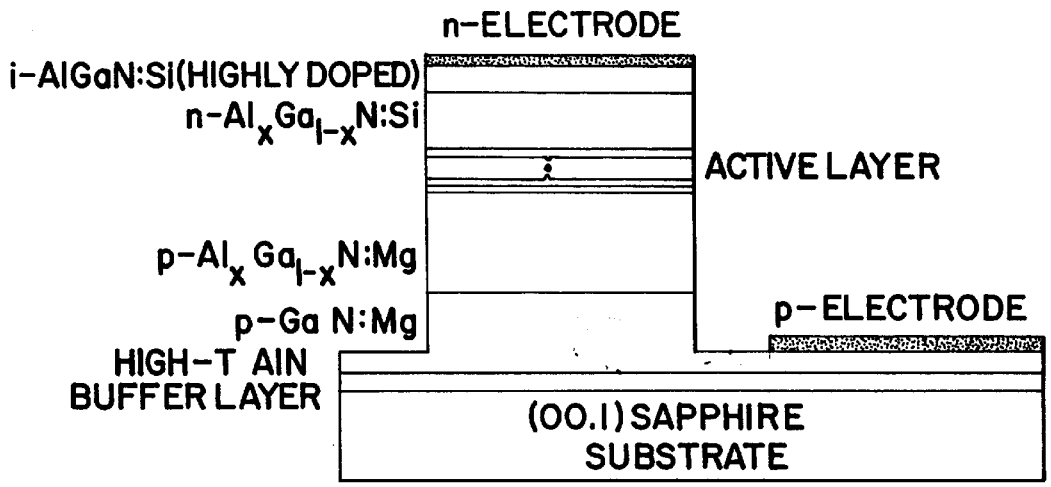

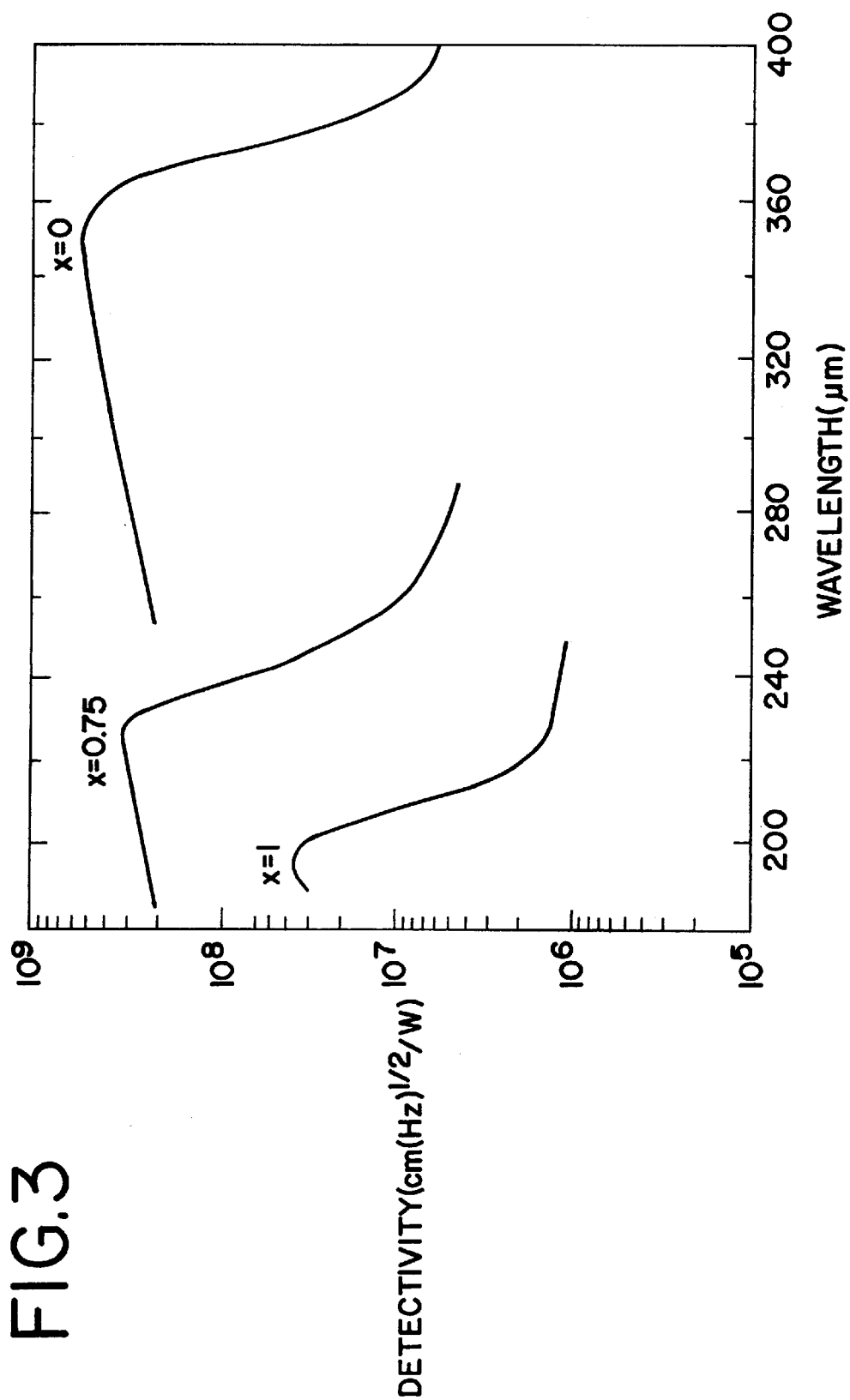

METHOD FOR MAKING III-NITRIDE LASER AND DETECTION DEVICE

This invention is made with government support under Grant BMDO/ONR-N-00014-93-1-0235, DARPA/ONR-N-00014-95-1-0983 and AASERT-N-00014-94-1-0902. The government has certain rights in the invention.

FIELD OF THE INVENTION

This invention relates to semiconductor III-V alloy compounds, as well as to a method of making III-V alloy compounds for use in diode lasers.

BACKGROUND OF THE INVENTION

The importance of semiconductor emitters and detectors is rapidly increasing along with progress in the opto-electronic field, such as optical fiber communication, optical data processing, storage and solid state laser pumping.

GaN-based compounds, especially $Al_xGa_{1-x}N$ alloys are the most promising material system for high performance and economical ultraviolet (UV) emitters photodetectors. With a bandgap energy from 3.4 eV to 6.2 eV, UV photodetectors with cut-off wavelengths from 200 nm (AlN) to 365 nm (GaN) can be fabricated from this alloy system. The direct bandgap of $Al_xGa_{1-x}N$-based detectors are also expected to have better intrinsic solar blindness than any other UV photodetectors. This makes them ideal for many applications, such as the surveillance and recognition of spacecraft, space-to-space communications, the monitoring of welding, as well as engines, combustion chambers, and astronomical physics.

Further, AlN, GaN, InN and their alloys (III-Nitrides) have direct bandgap energies from 1.9 eV (659 nm) to 6.2 eV (200 nm, which cover almost the whole visible down to mid-ultraviolet wavelength range. Therefore, one of the most important applications of these materials is to make visible and ultraviolet light-emitting diodes (LED) and laser diodes (LD) with high quantum efficiency, which are immediately needed in the current commercial markets and can be best achieved by these materials.

The performance of photoconductors and simple p-n junction photodiodes can be very limited in terms of speed, responsivity and noise performance. The optimization of GaN-based UV photoconductors requires sophisticated structures such as p-i-n layered structures, heterostructures or even quantum wells.

To fabricate these structures and achieve high-performance photodetectors, two critical issues need to be addressed. One is the high resistance of the p-type layer and its contact, which introduce signal voltage drop and excess noise at the contact point. The other problem is introduced by the p-type layer annealing procedure. The best way to illustrate these two problems is to describe their effect on the performances of current blue laser diodes.

Currently, the demonstrated blue laser diodes are not significantly practical since they have to be operated either in pulsed mode or CW at low temperature. In addition, their lifetime is short. A typical reported blue laser diode structure is a p-i-n structure with a p-type layer on top. Because of the high resistance of the p-type layer and its contact, excess heating at high current densities is generated, which leads to the failure of the device. Other problems exist as a result of the growing procedure, which are as follows: First, n-type layers are grown, followed by InGaN MQW; Mg-doped layers are then grown. Finally, thermal annealing at about 700° C. or low-energy electron beam irradiation (LEEBI) is performed to convert the top GaN:Mg or AlGaN:Mg to p-type. Both of these procedures will deteriorate the quality of the bottom layers, including the promotion of defect and impurity propagation, interfaces deterioration and, worse than that, the dissociation of the InGaN active layer and interface quality of the InGaN multi-quantum-well, since InGaN begins to dissociate at temperatures above 500° C.

With regard to emitters, III-Nitride based LEDs have been recently successfully developed and commercialized, providing coverage from yellow to blue. Further, blue laser diodes are known in pulsed mode at room temperature and continuous mode at about 40° C. Blue or short-wavelength laser diodes are in demand primarily because of their immediate need in optical storage and full color flat-panel display. The optical storage density is inversely proportional to the square of the read-write laser diode. By simply replacing the currently used laser diode (780 nm) with blue laser diode (410 nm), the storage density can be enhanced by almost four times.

SUMMARY OF THE INVENTION

An object, therefore, of the invention is a III-Nitride alloy for use in photoconductors and diodes having high quantum efficiency.

A further object of the subject invention is a GaN-based composition in a p-i-n structure of high quality.

A still further object of the subject invention is an alloy of the composition $Al_xGa_{1-x}N$ in a p-i-n structure with the p-type layers adjacent the substrate.

Those and other objects are attained by the subject invention wherein an $Al_xGa_{1-x}N$ alloy (X=0→1) with $In_yGa_{1-y}N$ (Y=0→1) is grown by MOCVD procedure in a p-i-n structure with the p-type layer adjacent the substrate. In the method of the subject invention, buffer layers of p-type material are grown on a substrate and then doped. These p-type layers are further treated with ion implantation of Group I elements. The active layers and cap layers of n-type material are next grown and doped. The structure is masked and etched as required to expose a surface which is ion implanted and annealed. A p-type surface contact is formed on this ion-implanted surface which is of sufficiently low resistance as to provide good quality performance for use in a device.

DESCRIPTION OF THE DRAWINGS

FIG. 1 is a cross-section of a III-Nitride based diode structure according to the subject invention.

FIG. 2 is a cross-section of another embodiment of the III-Nitride based diode structure of the subject invention.

FIG. 3 is a graph showing the spectral response of $Al_xGa_{1-x}N$ photoconductors.

DETAILED DESCRIPTION OF THE INVENTION

The reactor and associated gas-distribution scheme used herein are substantially as described in U.S. Pat. No. 5,384,151. The system comprises a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil backdiffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a hydrogen flow of 4 liters min$^{-1}$, and the working pressure of 78 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas sources used in this study for the growth of AlGaN by LP-MOCVD are listed below.

| Group-III Sources | Group-V Source |
|---|---|
| $In(CH_3)_3$ | $NH_3$ |
| $In(C_2H_5)_3$ | |
| $(CH_3)_2In(C_2H_5)$ | |
| $Al(CH_3)_3$ | |
| $Al(C_2H_5)_3$ | |
| $Ga(CH_3)_3$ | |
| $Ga(C_2H_5)_3$ | |

An accurately metered flow of purified $H_2$ for TMI is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure and diluted ammonia ($NH_3$) is used as a source of N. The metal alkyl or hydride flow can be either injected into the reactor or into the waste line by using two-way valves In each case, the source flow is first switched into the waste line to establish the flow rate and then switched into the reactor. The total gas flow rate is 8 liters min$^{-1}$ during growth. Stable flows are achieved by the use of mass flow controllers.

Dopants usable in the method of the subject invention are as follows:

| n dopant | p dopant |
|---|---|
| $H_2Se$ | $(CH_3)_2Zn$ |
| $H_2S$ | $(C_2H_5)_2\ Zn$ |
| $(CH_3)_3Sn$ | $(C_2H_5)_2\ Be$ |
| $(C_2H_5)_3Sn$ | $(CH_3)_2Cd$ |
| $SiH_4$ | $(\eta C_2H_5)_2Mg$ |
| $Si_2H_6$ | |

The substrate can be GaAs, Si, $Al_2O_3$, MgO, SiC, ZnO, $LiGaO_2$, $LiAlO_2$, $MgAl_2O_4$ or GaN. Preferably, sapphire ($Al_2O_3$) is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:
1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

The invention is described in accordance with the drawings and, in particular, with respect to FIGS. 1 and 2. FIG. 1 is a cross-section of a III-Nitride based laser diode structure formed in accordance with the subject invention for use on a photo emitter. FIG. 2 is a cross-section of an embodiment of III-Nitride based laser diode structure for use in a photo detector.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 500° and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

For best results, all surfaces of the growth reaction chamber are coated with a barrier coating capable of withstanding high temperatures and not reacting with the reactants and dopants utilized therein at such high temperatures. Preferably, a coating of AlN or of SiC is grown in situ in the reaction chamber to cover all surfaces therein. There is thus formed a stable layer that prevents oxygen and other impurities originating within the reaction chamber from reacting with the semiconducting layer to be grown.

High quality AlGaN/GaN may be grown in the method of the subject invention by low pressure metallorganic chemical vapor deposition (LP-MOCVD). The layers of the heterostructure are grown by an induction-heated horizontal cool wall reactor. Trimethylindium (TMI), Trimethylaluminum (TmAl) and Triethylgallium (TEG) are used as the sources of Indium and Gallium. Pure and diluted ammonium gas ($NH_3$) is used as the N source. Sample is grown on a sapphire substrate. A buffer layer of AlN and thin contact and confinement layers of GaN, $Al_xGa_{1-x}N$ (X=0→1) and $In_xGa_{x-1}N$ are individually laid on the substrate at thicknesses from 50Å to 1 μm. The undoped active layer may be $In_xGa_{1-x}N$ (0≦X ≦1) , $Al_yGa_{1-y}N$ (0≦Y≦1) or the superlattice structure of GaN/$In_xGa_{1-x}N$ (0≦X≦1). The optimum growth conditions for the respective layers are listed in Table 1. The confinement of the active layer for the subject invention may be as a heterostructure, separate confinement heterostructures or with a quantum well.

Doping is preferably conducted with bis-cyclopentadienyl magnesium ($BCP_2Mg$) for p-type doping and silane ($SiH_4$) for n-type doping. Doping is performed through a $BCP_2Mg$ bubbler with $H_2$ as carrier gas and at temperatures from −15° C. to ambient temperatures at 20–90 cm$^3$ min.$^{-1}$ and onto either a hot or cooled substrate (535° C.). $SiH_4$ may be simply directed at ambient temperatures onto the hot substrate at 20–90 cm$^3$ min.$^{-1}$.

In a preferred doping method for incorporating the maximum amount of p-type dopant on the layer, once the p-type layer to be doped is fully grown, the heat source is terminated and the substrate allowed to cool; the metal and hydride sources are terminated; the dopant flow, for instance DEMg, is initiated at the temperatures indicated for diffusion onto the cooled substrate/epilayer which has been previously grown. After about 2–3 minutes, the dopant flow is terminated and the next epilayer grown. By this method, it is found that $10^{20}$ atoms/cm$^3$ of Mg may be placed on the top surface of the epilayer.

When ion implanting, the principle of coulomb pairing is observed. In other words, copper, with two available electrons, is paired with the four available electron orbitals of Germanium. In like fashion, the one available electron of structure is then masked and etched with reactive ion etching to expose the lower contact GaN:Mg surface, which surface is then ion-implanted with copper ions to provide a conductive surface thereon. The n-contact is formed by deposition of Au, while the p-contact is formed by deposition of Pt/Au and annealing at 450° C. for 30 s. The laser diode structure is then functional.

Three separate structures are grown, with the different values for X and Y as set forth in Table 2.

TABLE 2

| Example | X or Y | $In_yGA_{1-y}N$ | $Al_xGa_{1-x}N$ | $In_yGa_{1-y}N$ | $Al_xGa_{1-x}N$ |
|---|---|---|---|---|---|
| 1 | 0.0 | GaN:Mg | GaN:Mg | GaN | GaN:Si |
| 2 | .75 | $In_{0.75}Ga_{0.25}N$:Mg | $Al_{0.75}Ga_{0.25}N$:Mg | $In_{0.75}Ga_{0.25}N$ | $Al_{0.75}Ga_{0.25}N$:Si |
| 3 | 0.0 | InN:Mg | AlN:Mg | GaN | AlN:Si |

Silver can also be paired with the available electron orbitals of Silicon or Germanium. Copper, Mercury or Silver ions may be implanted by the following procedure:

The ions are implanted using a Penning source. An energy of 700 KeV is used with a maximum beam intensity of 100 nA$^{-2}$. The implantation is tilted 70° from the <100> axis. After implantation, the objects were annealed capless in a flowing high-purity 0.4% PH$_3$/H$_2$ mixture at 700° C. for ten minutes.

TABLE 1

Optimum growth conditions of a $Al_xGa_{1-x}N/In_xGa_{1-x}N$ structure.

| | AlGaN | InGaN | GaN |
|---|---|---|---|
| Growth Pressure | 76 | 76 | 76 |
| Growth Temperature (°C.) | 535 | 535 | 535 |
| Total H$_2$ Flow (liter/min) | 3 | 3 | 3 |
| Al(C$_2$H$_5$) | 30 | — | — |
| TMI (cc/min) | — | 200 | — |
| TEG (cc/min) | 120 | 120 | 120 |
| NH$_3$ (cc/min) | 300 | 300 | 300 |
| Growth Rate (Å/min) | 150 | 300 | 250 |

EXAMPLES 1–3

A III-Nitride based laser diode structure as set forth in FIG. 1 is prepared. After coating the reaction chamber with AlN at a temperature of 1000° C., a thin (350Å) AlN buffer layer is first grown on a sapphire substrate prepared as set forth above. A contact layer of GaN (2000Å) is next grown and doped with magnesium to a concentration of $5 \times 10^{18} - 10^{20}$ atoms/cm$^{-3}$. A p-type confinement layer of $In_yGa_{1-y}N$ (300Å) is next grown and doped with magnesium, following which a layer of $Al_xGa_{1-x}N$ (1500Å) is grown and doped with magnesium. Finally, a layer of GaN is grown and doped with magnesium. The magnesium doped layers are next annealed at a temperature of about 700° C. After annealing, the hole concentration is $5 \times 10^{19} - 10^{18}$ cm$^{-3}$. Active layers of InGaN MQW (50Å) are next grown followed by confinement layers of GaN (500Å), $Al_1Ga_{1-x}N$ (500Å) and GaN (500Å), all doped with silicon followed by a buffer layer of GaN (500Å) doped with silicon for an electron concentration of $5 \times 10^{17} - 10^{18}$ cm$^{-3}$ and a cap or contact layer of GaN (200Å) highly doped with silicon as set forth above, i.e. to a concentration of $10^{20}$ atoms/cm$^3$. The

EXAMPLES 4–6

A III-Nitride based laser diode structure as set forth in FIG. 2 is prepared. The reaction chamber is coated with AlN as in Example 1. A thin (350Å) AlN buffer layer is then grown on a sapphire substrate prepared as set forth above. A lower contact layer of GaN (2000Å) is grown and doped with magnesium. $Al_xGa_{1-x}N$ is next grown (1 μm) and doped with magnesium to a concentration of $10^{20}$ atoms/cm$^{-3}$. The magnesium doped layer is next annealed at a temperature of about 700° C. resulting in a hole concentration of $5 \times 10^{19}$ atoms/cm$^{-3}$. Two active layers of InGaN MQW (50Å) are next grown: Two layers of $Al_xGa_{1-x}N$ are next grown (150–300Å) both doped with silicon, the upper layer being doped to a concentration of $10^{20}$ atoms/cm$^3$. The structure is then masked and etched by reactive ion etching to expose the lower contact AlGaN:Mg surface, which surface is then ion-implanted with copper ions to provide a conductive surface thereon. An n-contact is then formed by deposition of Au, while the p-contact is formed on the p-type surface by deposition of Pt/Au and annealing at 450° C. for 30 s. The laser diode structure is then functional.

Three separate structures are grown, with the different values for X and Y, as set forth in Table 3.

TABLE 3

| Example | X or Y | $Al_xGA_{1-x}N$:Mg | $In_yGa_{1-y}N$ | $Al_yGa_{1-y}N$:Si |
|---|---|---|---|---|
| 4 | 0 | GaN | GaN | GaN |
| 5 | 0.75 | $Al_{0.75}Ga_{0.25}N$ | $In_{0.75}Ga_{0.25}N$ | $Al_{0.75}Ga_{0.25}N$ |
| 6 | 1.0 | AlN | InN | AlN |

FIG. 3 shows the detectivity of $Al_xGa_{1-x}N$ photodetectors, such as in Examples 1–6, (X=0→1.0) . The detectivity increases with wavelength, showing high quantum efficiency. Near the bandgap, it exhibits a sharply decreasing detectivity. The cutoff wavelength is tuned by the Al composition, which varies from about 360 nm for GaN to 200 nm for AlGaN.

The structures of Examples 1–6 preserve the efficiencies of the p-i-n structures, while maintaining low defects, good interface quality, and good conduction at both the n and p contact points. The high doping level and the ion-implantation step provides a conductive p-layer surface while the necessary destructive annealing steps are performed prior to growth of the active layers, thereby retaining the properties necessary for a high-quality device.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed is:

1. A method of growing a III-V nitride compound semiconductor, comprising the steps of:
   a) providing a substrate;
   b) growing a buffer layer on said substrate;
   c) growing, doping and annealing a p-type lower contact layer on said buffer layer;
   d) growing, doping and annealing a p-type lower confinement layer over said lower contact layer;
   e) growing an active layer over said lower confinement layer;
   f) growing and doping an n-type upper confinement layer over said active layer;
   g) growing an upper n-type contact layer over said upper confinement layer;
   h) doping said upper contact layer and thereby forming an unfinished structure;
   i) masking and etching said unfinished structure to expose said lower contact layer;
   j) ion implanting said exposed lower contact area with ions selected from the Group consisting of Ag, Hg, Cu, Si and Ge; and
   k) making an ohmic contact on each of said n-type and p-type contact layers to form said III-V nitride compound semiconductor.

2. The method of claim 1 wherein said substrate is $Al_2O_3$ or SiC.

3. The method of claim 1 wherein said lower contact layer is GaN or AlGaN and is doped with Mg.

4. The method of claim 1 wherein said lower contact layer is doped with a dopant selected from the group consisting of Mg, Zn, Be, Si, Ge and Sn.

5. The method of claim 1 wherein said active layer is $In_yGa_{1-y}N$, ($0 \leq Y \leq 1$), $Al_xGa_{1-x}N$ ($0 \leq X \leq 1$) or the superlattice structure of $GaN/Ga_{1-z}In_zN$ ($0 \leq Z \leq 1$).

6. The method of claim 1 wherein said upper confinement layer is $Ga_xAl_{1-x}N$ ($0 \leq X \leq 1$).

7. The method of claim 1 wherein said upper contact layer is GaN.

8. The method of claim 1 wherein said upper contact layer is doped with Si or Ge.

9. A method of preparing a III-Nitride based laser diode structure comprising the steps of:
   a) providing a p-i-n structure by growing and doping a lower p-type contact layer by growing a p-type layer on a substrate;
   b) annealing said p-type layer;
   c) growing, doping a p-type confinement layer over said p-type layer;
   d) annealing said p-type confinement layer;
   e) growing an active layer on said confinement layer;
   f) growing and doping a n-type confinement layer over said active layer;
   g) growing and doping an upper n-type contact layer over said n-type confinement layer;
   h) masking and etching said p-i-n structure to expose said lower contact layer;
   i) ion implanting said exposed contact layer with Ag, Hg or Cu; and
   j) forming an ohmic contact on said ion implanted lower contact layer and on said upper contact layer thereby forming said III-Nitride based laser diode structure.

10. The method of claim 9 wherein said structure is grown on a substrate which is selected from the group consisting of $Al_2O_3$, SiC, GaAs, Si, MgO, ZnO, $LiGaO_3$, $LiAlO_2$, $MgAlO_4$ and GaN.

11. The method of claim 10 further including the step of forming a buffer layer on said substrate.

12. The method of claim 9 wherein said lower contact layer is GaN and AlGaN.

13. The method of claim 9 wherein said lower contact layer is doped with a dopant selected from the group consisting of Mg, Zn, Be, Si, Ge and Sn.

14. The method of claim 9 wherein said active layer is $In_yGa_{1-y}N$, ($0 \leq Y \leq 1$), $Al_xGa_{1-x}N$ ($0 \leq X \leq 1$) or the superlattice structure of $GaN/Ga_{1-z}In_zN$ ($0 \leq Z \leq 1$).

15. The method of claim 9 wherein said upper contact layer is AlGaN or GaN.

16. The method of claim 9 wherein said upper contact layer is doped with a dopant selected from the group consisting of Mg, Zn, Be, Si, Ge and Sn.

* * * * *